(12) United States Patent
Ghoshal et al.

(10) Patent No.: US 6,658,861 B1
(45) Date of Patent: Dec. 9, 2003

(54) COOLING OF HIGH POWER DENSITY DEVICES BY ELECTRICALLY CONDUCTING FLUIDS

(75) Inventors: Uttam Ghoshal, Austin, TX (US); Andrew Carl Miner, Austin, TX (US)

(73) Assignee: Nanocoolers, Inc., Austin, TX (US)

( * ) Notice: Subject to any disclaimer, the term of this patent is extended or adjusted under 35 U.S.C. 154(b) by 0 days.

(21) Appl. No.: 10/314,018

(22) Filed: Dec. 6, 2002

(51) Int. Cl.[7] ................................................. F25B 21/02
(52) U.S. Cl. ............................................ 62/3.7; 62/259.2
(58) Field of Search ........................... 62/3.2, 3.3, 3.6, 62/259.2, 434; 165/104.19

(56) References Cited

U.S. PATENT DOCUMENTS

| | | | | |
|---|---|---|---|---|
| 3,654,528 A | * | 4/1972 | Barkan | 317/234 |
| 4,177,015 A | * | 12/1979 | Davidson | 417/50 |
| 5,712,448 A | * | 1/1998 | Vandersande et al. | 136/203 |
| 5,991,351 A | * | 11/1999 | Woolley | 376/147 |

\* cited by examiner

*Primary Examiner*—Melvin Jones
(74) *Attorney, Agent, or Firm*—William L. Botjer

(57) ABSTRACT

A system to extract heat from a high power density device and dissipate heat at a convenient distance. The system circulates liquid metal in a closed conduit using one or more electromagnetic pumps for carrying away the heat from high power density device and rejecting the heat at a heat sink located at a distance. The system may make use of a thermoelectric generator to power the electromagnetic pumps by utilizing the temperature difference between the inlet and outlet pipes of the heat sink. The system also provides networks of primary and secondary closed conduits having series and parallel arrangements of electromagnetic pumps for dissipating heat from multiple devices at a remotely located heat sink.

16 Claims, 7 Drawing Sheets

COOLING OF HIGH POWER DENSITY DEVICES BY ELECTRICALLY CONDUCTING FLUIDS

BACKGROUND

The present invention relates to a system for dissipating heat from a high power density device (HPDD). More specifically, the invention relates to a system that helps in effective dissipation of heat at a distance away from the HPDD.

Electronic devices such as central processing units, graphic-processing units, laser diodes etc. generate a lot of heat during operation. In case the generated heat is not dissipated properly from high power density devices, this may lead to temperature buildup in these devices. The buildup of temperature can adversely affect the performance of these devices. For example, excessive temperature buildup may lead to malfunctioning or breakdown of the devices. So, it is important to remove the generated heat in order to maintain normal operating temperatures of these devices.

The heat generated by HPDD is removed by transferring the heat to ambient atmosphere. Several methods are available to transfer heat from a HPDD to the atmosphere. For example, an electric fan placed near a HPDD can blow hot air away from the device. However, a typical electric fan requires a large amount of space and thus it may not be desirable to place a fan near the HPDD due to space constraints in the vicinity of the HPDD. In case of notebook computers or laptops, there is additional constraint on the positioning of the fans due to the compact size of these devices. For at least the foregoing reasons, it would be desirable to provide heat dissipation (e.g. using a fan) at a location away from the HPDD.

Another way to dissipate heat from a HPDD involves the use of a large surface area heat sink. Essentially, the heat sink is placed in contact with the HPDD to transfer heat away from the HPDD into the heat sink. The transferred heat is then dissipated through the surface area of the heat sink, thereby reducing the amount of temperature. buildup in the HPDD. In case a significant amount of heat is generated, a larger-sized heat sink is necessary to adequately dissipate the heat. Also in some cases the heat sink cannot be placed adjacent to HPDD due to form factor restriction. This may be due to non-availability of space near the HPDD or due to other devices/components located nearby that cannot withstand the rise in temperature due to dissipated heat. One way of dealing with the form factor limitation is to place a heat sink at a sufficiently large distance from the HPDD. In this case, heat has to be transferred from HPDD to the heat sink before being dissipated to the atmosphere.

A heat pipe is a device that can effectively transfer heat from one point to another. It consists of a sealed metal tubular container whose inner surfaces have a capillary wicking material. A fluid flows along the wick structure of the heat pipe. FIG. 1 shows a heat pipe 101. It has an inner lining 103 of micron scale wick structures. A HPDD 105 transfers heat to an end 107 of heat pipe 101. Liquid at end 107 absorbs the heat, evaporates and moves to a cold end 109 of the heat pipe. The evaporated vapor comes in contact of cold end 109, condenses and dissipates heat. The condensed liquid moves back to end 107 by gravitation or by capillary action of the inner lining 103. The wick like structure of lining 103 provides capillary driving force to return the condensate to end 107.

A Heat pipe is useful in transferring heat away from the HPDD when the form factor and other constraints limit dissipation of heat near the HPDD itself. Further, it has the ability to transport heat against gravity with the help of porous capillaries that form the wick.

Heat pipes exploit liquid-vapor phase change properties. Thus, maximum heat transfer is limited by vapor/liquid nucleation properties. Interface resistance between the metal surface and the liquid layer also limits the maximum heat flow. Heat pipes do not solve the problems of interface resistances at the hot source end and the cold sink end. Interface resistance between the metal surface and the liquid layer also limits the maximum heat flow. It is also not possible to cool multiple hot sources using a single heat pipe. Often these heat pipes contain CFC fluids that are not environment-friendly. The performance of these heat pipes depend on the orientation of the heat pipe structure with respect to the gravitational forces, operating temperatures, and the nature of fluids in the loop. The dependence of performance on orientation restricts the flexible positioning of heat pipes.

The above-discussed limitations of heat pipes have made forced fluid cooling an attractive option. The forced fluid cooling is based on circulating water through a HPDD. Water carries away heat from the HPDD and dissipates the heat at a sink placed at a distance. The heat is dissipated at the sink using fluid-fluid heat exchangers such as finned radiators with natural or forced convection. In forced fluid cooling, more than one HPDD can be cooled in a single loop.

However, the use of water in forced fluid cooling has some limitations. The low thermal conductivity of water limits its effectiveness as a heat transfer fluid. So, in this case only mode of transfer of heat is convection. Transfer of heat by conduction is negligible. Also, water is circulated using mechanically moving pumps that are largely unreliable, occupy large volumes, and contribute to vibration or noise.

U. S. Pat. No. 3,654,528 titled "Cooling Scheme For A High Current Semiconductor Device Employing Electromagnetically-Pumped Liquid Metal For Heat And Current Transfer" describes the use of liquid metal to spread heat uniformly in the heat sink placed in contact with a wafer. However, this patent describes heat dissipation in the proximity of the heat-generating device and does not address to the form factor limitation. Further, the use of electromagnetic (EM) pumps requires an extra power supply that generates heat. Removal of this additional heat adds to the burden.

In light of the above discussion it is clear that methods provided by the prior art do not satisfactorily address the issue of removal of heat at a desirable distance away from a high power density device. Thus there is a need for a flexible method for managing dissipation of heat at a distance away from the high power density device.

SUMMARY

It is an object of the invention to provide an efficient and flexible method of dissipating heat away from a high power density device.

It is another object of the invention to provide a system for effective dissipation of heat from high power density devices, while taking care of the form factor limitations.

It is another object of the invention-to provide a system for the effective transfer of heat from high power density devices at a predefined distance away from the device.

It is another object of the invention to provide a system that uses electromagnetic pumps for circulating liquid metal for carrying away the heat generated by high power density device.

It is another object of the invention to provide electromagnetic pumps that use polymers or refractory metals as the material of construction of the conduit and gallium indium alloy as the liquid metal.

It is yet another object of the invention to provide an electromagnetic generator to power the electromagnetic pumps.

It is yet another object of the invention to enable the use of fluid-fluid heat exchangers (including condensers, radiators etc.) for dissipating heat generated by high power density device.

The invention provides a system for effective removal of heat from a high power density device and dissipating the heat at a distance. The system in accordance with the invention has a solid-fluid heat exchanger mounted on a high power density device. A closed conduit carrying liquid metal passes through the solid-fluid heat exchanger. The liquid metal is circulated in the conduit. The liquid metal carries away the heat generated by the high power density device and dissipates it at a heat exchanger or heat sink provided at a predefined distance away from the device. This system is highly flexible and can be used in different embodiments depending on form factor limitations. The same conduit (carrying the liquid metal) can be used for carrying heat away from multiple devices. Multiple pumps arranged in series or parallel arrangements may also be provided. Two or more loops (of the conduit) can use a common pump or common solid-fluid heat exchanger. A loop can dissipate heat, which is further carried away by another loop. More and more complex network of loops as desired can be formed.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

Figure 1:
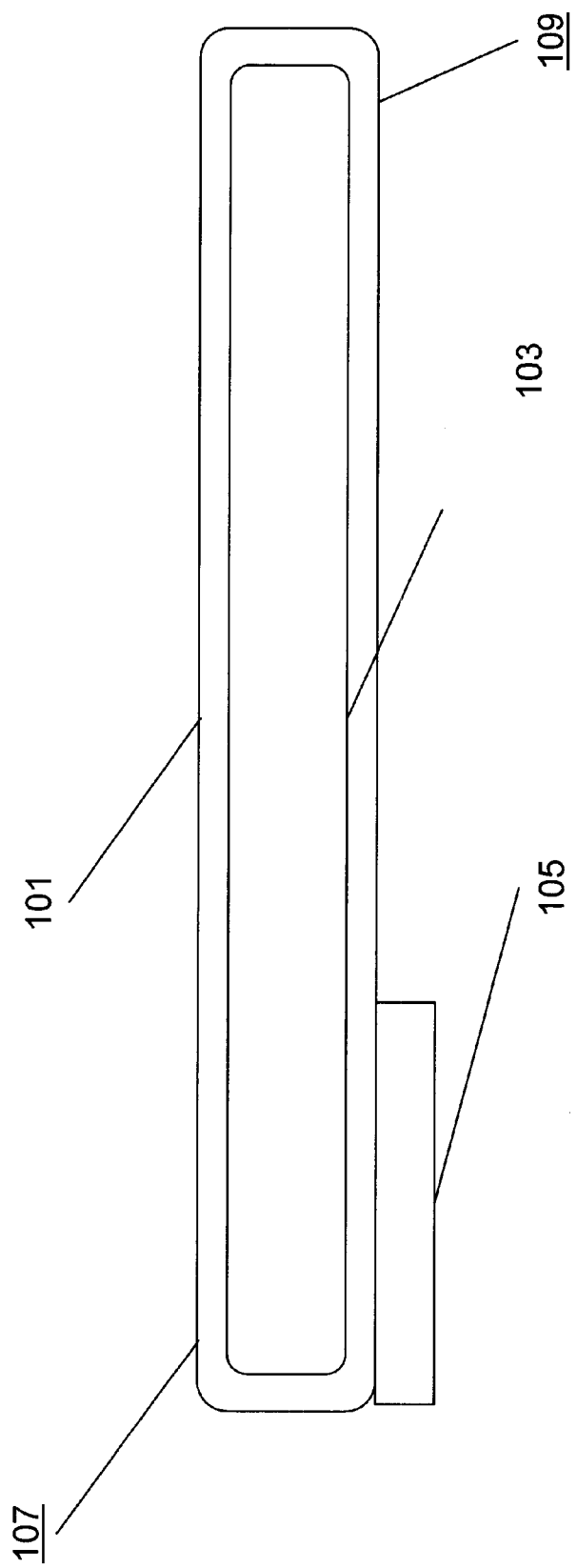
FIG. 1 shows the design of a heat pipe existing in prior art.
Figure 2:
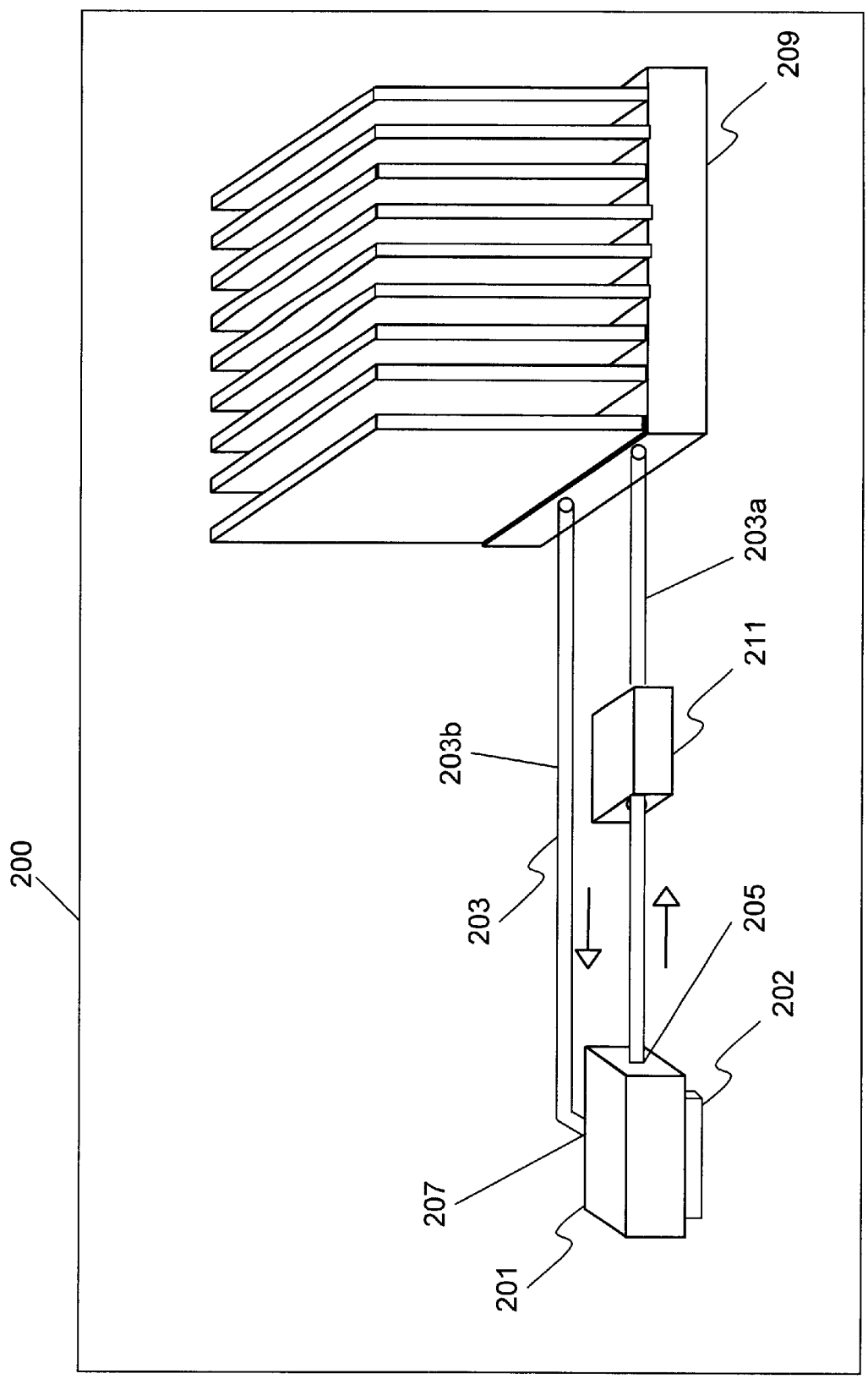
FIG. 2 shows a system for dissipating heat from a high power density device at a distance in accordance with the preferred embodiment of the invention.

FIG. 2 shows a system 200 for dissipating heat from high power density devices. System 200 comprises a solid-fluid heat exchanger 201 placed adjacent to the high power density device 202. A solid-fluid heat exchanger 201 is filled with liquid metal that absorbs the heat from the high power density device 202. A conduit 203 passes through solid-fluid heat exchanger 201 that takes away the liquid metal through an end 205 of solid-fluid heat exchanger 201 and brings liquid metal back into solid-fluid heat exchanger 201 through an end 207. Section 203a of conduit 203 carries hot liquid metal away from end 205 of solid-fluid heat exchanger 201 to a heat sink 209 provided at a predefined distance from solid-fluid heat exchanger 201. Heat sink 209 releases the heat to the atmosphere. The cooled liquid metal is then circulated back to solid-fluid heat exchanger 201 through section 203b of conduit 203. An electromagnetic pump 211 provides the power for circulating the liquid metal in the form of a closed loop. In this manner, system 200 provides for the transport and dissipation of heat at a predefined distance away from high power density device 202. This distance is determined based on the form factor (the configuration and physical arrangement of the various components in and around the high power density device 202). Thus system 200 provides for heat dissipation in the cases where dissipating heat in the proximity of the high power density device 202 is not desirable. For example, in a computer, in case the heat dissipated by components such as the microprocessor or the power unit is in proximity of components like memory, this heat may lead to permanent loss of data from memory. Thus it is desirable that the heat generated by the microprocessor/power unit is dissipated at a position away from components that may get damaged.

Heat sink 209 is constructed of a low thermal resistance material. Examples of such materials include copper and aluminum. Heat sink 209 has a large surface area for effectively dissipating heat to the atmosphere. Heat sink 209 may dissipate heat by natural convection or by forced convection with the use of a fan. A finned structure (as shown in the figures) is sometimes used as a heat sink. In fact, the finned structure may also have liquid metal circulating through its fins. It will be apparent to one skilled in the art that any heat sink structure (used for transferring heat to the atmosphere) may be employed in the system without departing from the scope of the invention.

Conduit 203 is constructed of polymer materials such as teflon or polyurethane. Alternatively, refractory metals such as vanadium or molybdenum may also be used as the material of construction of conduit 203. Polymers like teflon prove to be good conduit materials as they are inert to most chemicals, provide low resistance to flow of liquids and are resistant to high temperature corrosion. Solid-fluid heat exchanger 201 comprises a thermally conducting surface closely attached to the high power density device and a housing containing the liquid metal. For processor chip cooling applications, the thermally conducting surface could be a thin-film tungsten, nickel layer on the backside of the processor or a discrete surface of tungsten, nickel, anodized aluminum or nickel-coated aluminum soldered to the backside of the chip. The housing material could be an inert polymer (Teflon, polyurethane, etc.), glass or thermally conductive material such as tungsten, nickel, nickel-coated aluminum, anodized aluminum, nickel-coated copper etc.

System 200 may be used for dissipating heat from a wide variety of devices. For example high power density device 202 of FIG. 2 may be a micro scale device like a microelectronic chip, an optoelectronic chip, arrays of hot chips, a laser diode, light emitting diodes (LEDs), an array of LEDs etc. High power density device 202 may also be a central processing unit of a computer, graphical processor unit or a light bulb. System 200 also finds application in biological, chemical, or nuclear reactors to dissipate heat generated by these reactors.

Figure 3:
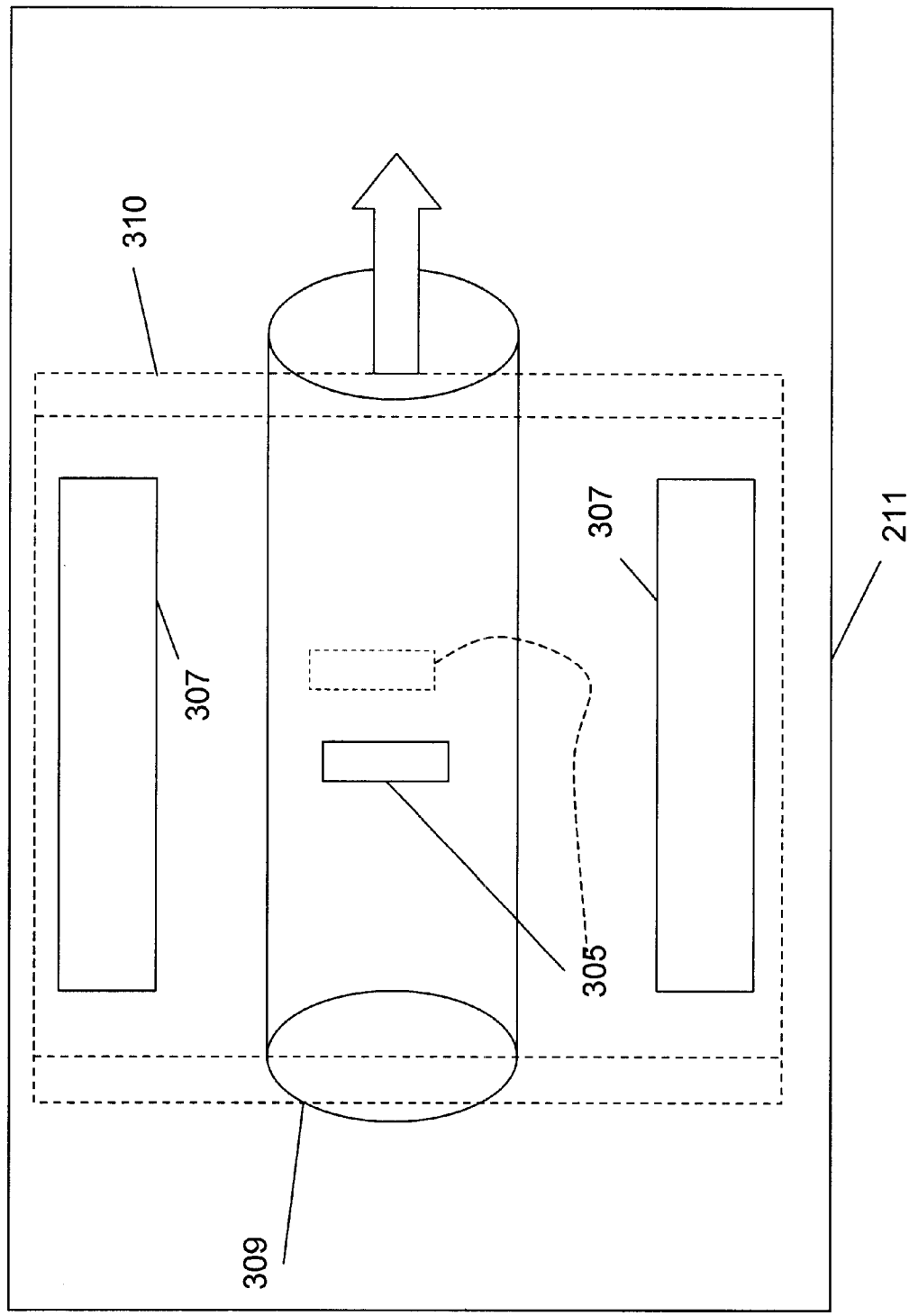
FIG. 3 shows the principle of an electromagnetic pump provided by the abovementioned system for circulating liquid metal.

FIG. 3 shows the principle of operation of electromagnetic pumps 211 employed in the above-mentioned embodiment. Electromagnetic pump 211 comprises of a pair of electrode plates 305 placed vertically facing each other. A DC (direct current) voltage is applied across the electrode plates. The DC voltage produces an electric field across electrode plates 305. A pair of permanent magnets 307 is arranged facing each other above and below the plane containing electrode plates 305. A tube 309 carries liquid metal. The direction of magnetic field generated by the permanent magnets 307 is perpendicular to the direction of electric field provided by the electrode plates 305. An electromagnetic force acts on the liquid metal causing it to flow in a direction perpendicular to the plane of electric and magnetic fields (as shown by the block arrow in FIG. 3). It would be evident to one skilled in the art that the method of pumping can be implemented in several different ways based on the abovementioned principle. For example, DC electromagnetic pumps (as described above) can be utilized in applications where DC sources are available while induction electromagnetic pumps utilizing polyphase induction coils can be used in cases where physical contact to the liquid metal is undesirable (say, where the liquid metal is corrosive).

In certain applications, the system may need to be provided with electromagnetic interference (EMI) shielding to shield the high power density device from electromagnetic radiations generated by the pump. These electromagnetic radiations, if not shielded, might adversely affect the performance of the high power density device or its components. Accordingly, the electromagnetic pump is enclosed within a housing that shields the high power density device. This EMI shielding may be provided using standard methods such as magnetic shields and EMI shielding tapes. As shown in FIG. 3, magnetic shield 310 confines the magnetic field within the pump. The magnetic shield 310 may be made using high magnetic permeability materials such as steel, nickel, alnico, or permandur or other specially processed materials.

In the preferred embodiment, tube 309 is constructed of polymer materials such as Teflon or polyurethane. Teflon has the advantage that it can be easily machined. Alternatively, refractory metals such as tungsten or molybdenum may also be used as the material of construction of tube 309. Ultra-thin anodized aluminum or nickel-coated aluminum or copper can also be used.

In the preferred embodiment, the liquid metal carried by tube 309 is an alloy of gallium and indium. Preferred compositions comprise 65 to 75% by mass gallium and 20 to 25% indium. Materials such as tin, copper, zinc and bismuth may also be present in small percentages. One such preferred composition comprises 66% gallium, 20% indium, 11% tin, 1% copper, 1% zinc and 1% bismuth. Some examples of the commercially available Gain alloys include galistan—a concoction popular as a substitute for mercury (Hg) in medical applications, and newmerc. The various properties of Ga—In alloy make it desirable liquid metal for use in heat spreaders. The Ga—In alloy spans a wide range of temperature with high thermal and electrical conductivities. It has melting points ranging from −15° C. to 30° C. and does not form vapor at least upto 2000° C. It is not toxic and is relatively cheap. It easily forms alloys with aluminum and copper. It is inert to polyimides, polycarbonates, glass, alumina, Teflon, and conducting metals such as tungsten, molybdenum, and nickel (thereby making these materials suitable for construction of tubes).

However, it is apparent to one skilled in the art that a number of other liquid metals may be used without departing from the scope of the invention. For example, liquid metals having high thermal conductivity, high electrical conductivity and high volumetric heat capacity can be used. Some examples of liquid metals that can be used in an embodiment of the invention include mercury, gallium, sodium potassium eutectic alloy (78% sodium, 22% potassium by mass), bismuth tin alloy (58% bismuth, 42% tin by mass), bismuth lead alloy (55% bismuth, 45% lead) etc. Bismuth based alloys are generally used at high temperatures (40 to 140° C.). Pure indium can be used at temperatures above 156° C. (i.e., the melting point of indium).

Figure 4:
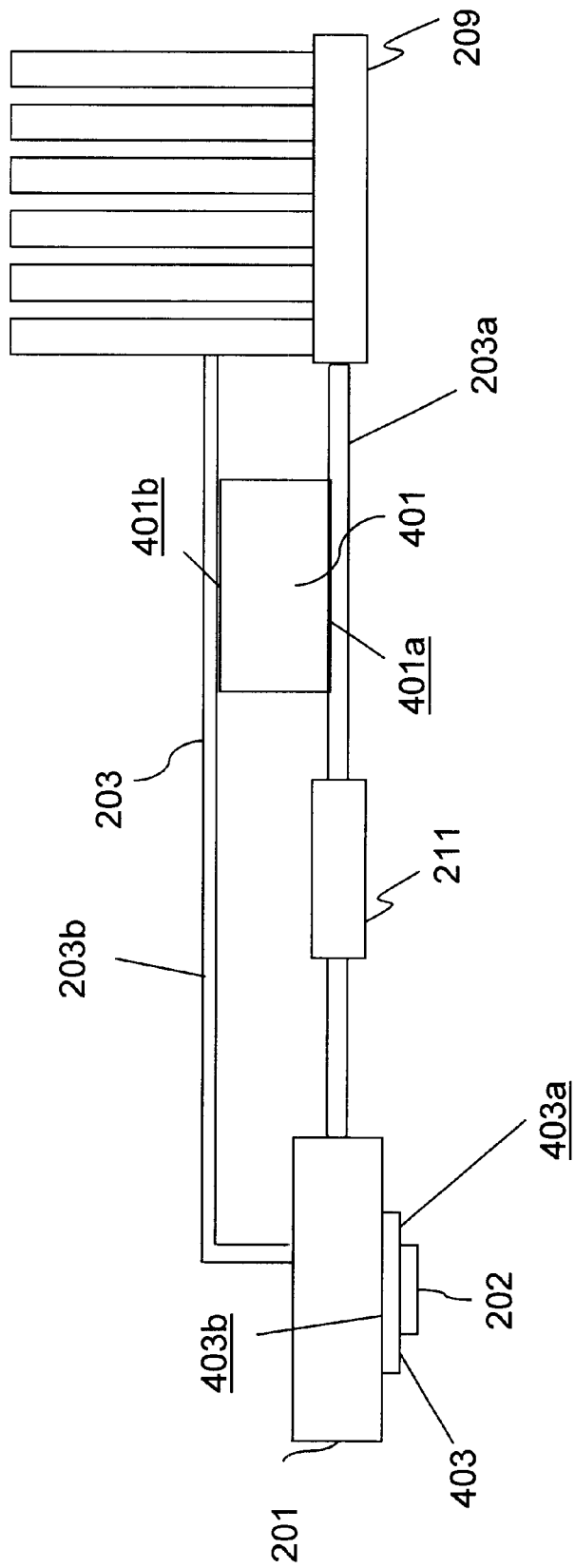
FIG. 4 shows the use of thermoelectric generator and thermoelectric cooler in the abovementioned system in accordance with an alternate embodiment of the invention.

FIG. 4 shows another embodiment of the invention. The embodiment comprises a thermoelectric generator 401 and a thermoelectric cooler 403. Thermoelectric generator 401 is provided for powering electromagnetic pump 211 while thermoelectric cooler 403 is provided for a first stage spot cooling of the high power density device 202.

A face 401a of thermoelectric generator 401 is placed in contact with section 203a of conduit 203. Section 203a carries hot liquid metal to heat sink 209 and has a high temperature. A Face 401b of thermoelectric generator 401 is placed in contact with section 203b of conduit 203 that carries liquid metal (that has been cooled after dissipating heat) away from the heat sink 209 to solid-fluid heat exchanger 201. Face 401b is thus at a relatively low temperature. The temperature difference between the two faces of thermoelectric generator 401 is utilized to produce potential difference for powering electromagnetic pump 211. Thus, in this case there is no need of external power source to run electromagnetic pump 211. The external power supply, if used, generates heat that has to be removed. This adds to the burden of heat removal from the system. By using potential difference generated by thermoelectric generator 213 to run electromagnetic pump 211; this added burden is done away with.

Thermoelectric generator 401 is comprised of series of p type semiconductor members and n type semiconductor members sandwiched between thermally conducting, electrically-insulating substrates such as oxide-coated silicon wafers, aluminum nitride (AIN) and other thin ceramic wafers. Thermoelectric generator 401 utilizes the "Seebeck effect" to convert the temperature difference between the hot section 203a and the cold section 203b of conduit 203 to electrical energy in the form of a potential difference. The voltage generated by thermoelectric generator 401 depends on the temperature difference between the sections 203a and 203b. The performance (i.e. the ratio of electrical power to the heat flow into the hot end) of thermoelectric generator 401 is governed by the Seebeck coefficient and thermal conductivity of p and n type semiconductor members used to form the device. Alloys of bismuth (Bi), tellurium (Te), antimony (Sb) and selenium (Se) are the most commonly used materials for manufacturing the semiconductor members of thermoelectric generator 401 for devices operating near room temperature.

The use of thermoelectric generators provides sufficient power to drive the electromagnetic pumps. This may be illustrated using the following representative example:

The power requirement is dependent on the distance the fluid needs to move. Typically, this power requirement may range from few milli-watts (say for moving the fluid a distance of 10 cm in case of a laptop), to a watt (say for moving the fluid several meters in a server rack).

The coefficient of performance of a thermoelectric generator i.e. the ratio of electrical power to the heat flow into the hot end, is roughly:

$$\eta = \epsilon(\Delta T/T_h)$$

where E is the thermodynamic conversion efficiency, $\Delta T$ is the temperature differential between the hot and cold ends, and $T_h$ is the temperature of the hot end. The value of $\epsilon$ is 0.1 for conventional Bi/Sb/Te/Se alloys and Pb/Te/Se alloy materials. The typical temperature differential across the two ends of thermoelectric generator would be around 15–40 K (i.e., Kelvin). Assuming $\Delta T$=30 K and $T_h$=358 K (85° C.) the coefficient of performance $\eta$ of the thermoelectric generator comes out to be 0.0084. If the high power density device dissipates 100 W, the electrical power generated by the thermoelectric generator will be 0.84 W, which is sufficient for driving the electromagnetic pump. Of course, better thermoelectric generators can easily double the performance.

Thermoelectric cooler 403 provides a first stage spot cooling of the high power density device 202. Thermoelectric cooler 403 utilizes the "Peltier effect" to cool the high power density device 202. The construction of thermoelectric cooler 403 is similar to thermoelectric generator 401. A direct current supplied to the thermoelectric cooler 403 produces a temperature difference between its two surfaces. Thus, surface of thermoelectric cooler 403 in contact with high power density device 202 is at low temperature (with respect to high power density device 202) and surface of thermoelectric cooler in contact with solid-fluid heat exchanger 201 is at higher temperature (with respect to solid-fluid heat exchanger 201). The amount of cooling provided by thermoelectric cooler 403 is a function of the current supplied to it. The use of thermoelectric cooler 403 is desirable in cases where surface of high power density device 202 has uneven temperature distribution with some regions having temperature much greater than other regions. The first stage spot cooling provided by thermoelectric cooler 403 helps to make temperature distribution uniform on the surface of high power density device 202.

Figure 5:
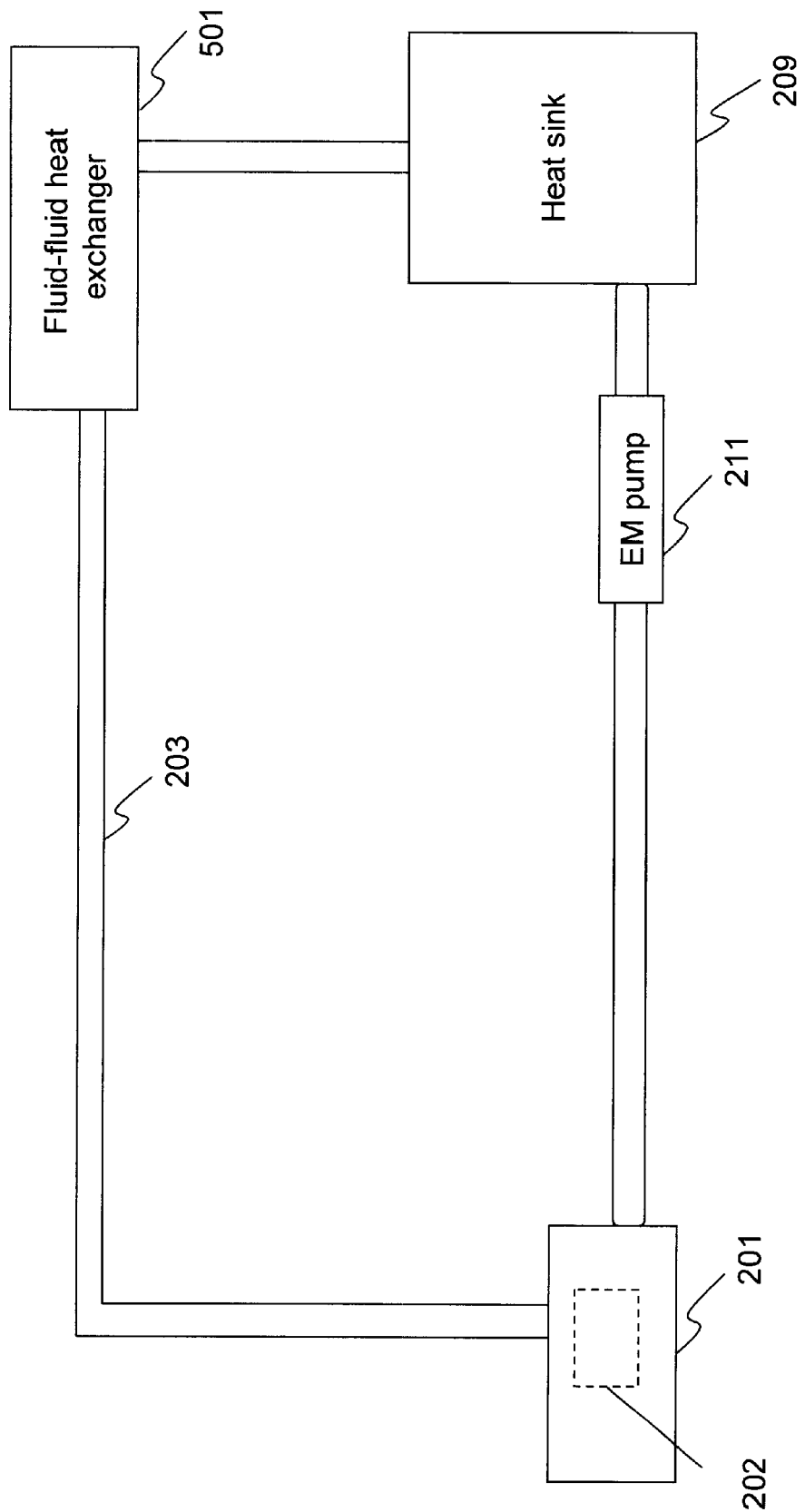
FIG. 5 shows an alternate embodiment that has a fluid-fluid heat exchanger in combination with the heat sink.

FIG. 5 shows yet another embodiment of the invention. In this embodiment a fluid-fluid heat exchanger 501 is provided in addition to heat sink 209 for dissipating heat from the liquid metal. Fluid-fluid heat exchanger 501 is provided for cases where additional cooling is required or the rate of cooling of liquid metal needs to be regulated. As shown in FIG. 5, liquid metal coming out through heat sink 209 is further cooled using heat exchanger 501 before being circulated back to solid-fluid heat exchanger 201. Fluid-fluid heat exchanger 501 makes use of a fluid to absorb the heat from liquid metal. This fluid enters fluid-fluid heat exchanger 501 at one end absorbs heat from liquid metal and comes out through another end. Thus, heat is transferred from liquid metal to the fluid. The cooled liquid metal is then circulated back to solid-fluid heat exchanger 201 through section 203b of conduit 203. Electromagnetic pump 211 provides the power for circulating the liquid metal in form of a closed loop. In this manner, this embodiment provides for the transport and dissipation of heat at multiple positions away from high power density device 202(shown using dashed lines).

Fluid-fluid heat exchangers make use of transfer of heat between two fluids over a common surface. Thus, use of liquid metal in the invention makes it possible to use a heat exchanger for dissipating heat. Fluid-fluid heat exchanger 501 provides controlled cooling such that the rate of cooling may be regulated depending on requirements. The regulation of cooling rate may be achieved by varying the flow rate or temperature of the fluid in fluid-fluid heat exchanger 501.

The fluids that are most commonly used in heat exchangers are water, air or freon. Fluid-fluid heat exchanger 501 can be tubular shell and tube type of heat exchanger with counter or concurrent flow. Heat exchanger 501 can also be a plate type heat exchanger. Fluid-fluid heat exchanger 501 may be replaced by multiple heat exchangers connected in series or parallel. In fact, in place of the combination of heat exchanger 501 and heat sink 209, heat exchanger 501 alone can be used to dissipate heat. It will be apparent to one skilled in the art that any device that can dissipate/extract heat from liquid metal (e.g. thermoelectric cooler, vapor compression cooler) can replace heat exchanger 501 without departing from the scope of the invention.

Figure 6A:
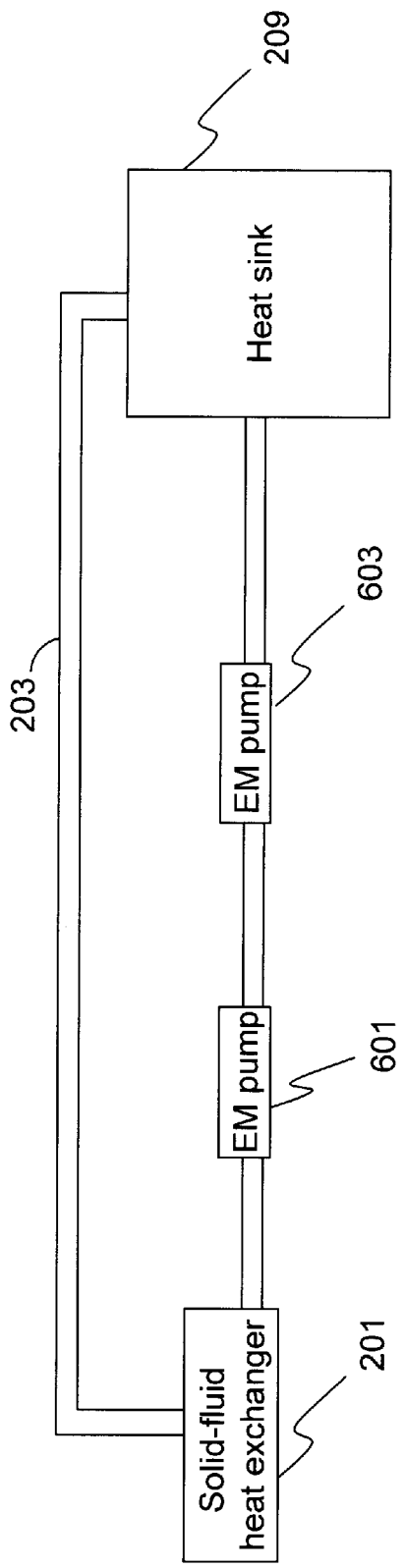
FIG. 6A shows an embodiment that has two electromagnetic pumps in series.

FIG. 6A shows two electromagnetic pumps 601 and 603 in series that pump liquid metal through conduit 203. Multiple electromagnetic pumps 601 and 603 are provided in series configuration where power supplied by one pump is not sufficient to circulate the liquid metal in the form of a closed loop. This may be the case when heat sink 209 is placed at a relatively large distance away from solid-fluid heat exchanger 201 ( e.g. in case of a server rack). Two electromagnetic pumps 601 and 603 may also be useful where there is sudden loss in the pressure head. In case where the pipes take sharp turns (like in case of laptop joints) a significant drop in the pressure is observed. Due to reasons mentioned above more than two electromagnetic pumps may need to be provided in series.

Figure 6B:
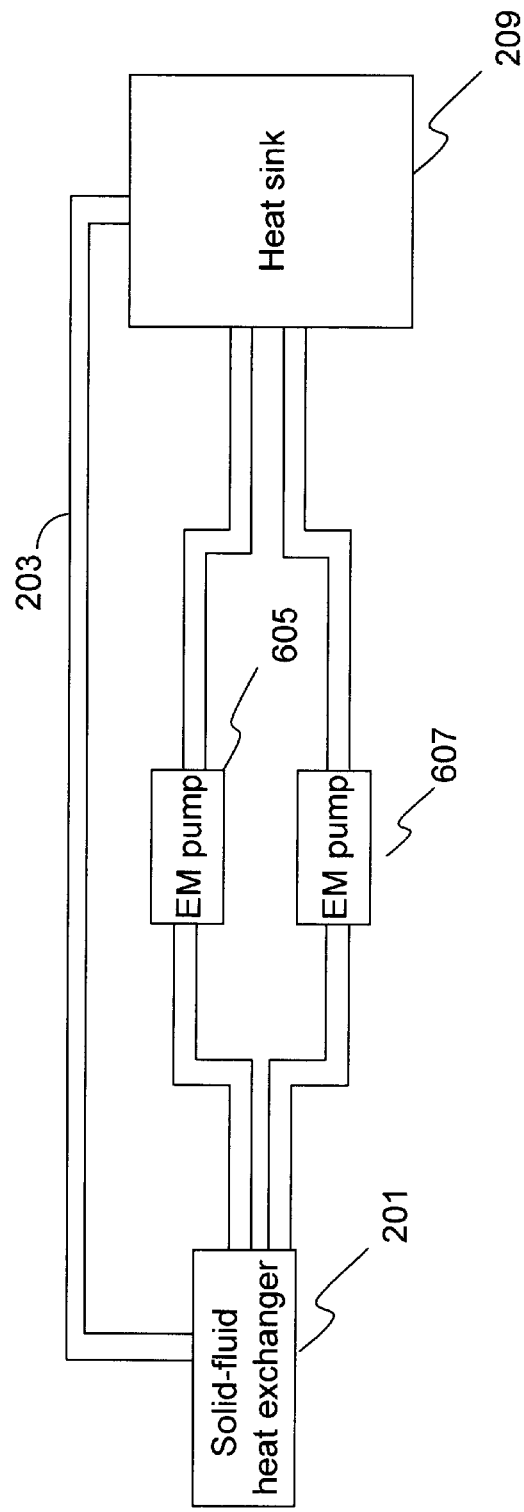
FIG. 6B shows an embodiment that has two electromagnetic pumps placed in parallel.

FIG. 6B shows an alternate arrangement where two electromagnetic pumps 605 and 607 arranged in parallel. A parallel arrangement of electromagnetic pumps may be used in case there are some restrictions on the diameter of the conduit (say, due to form factor limitations). The parallel arrangement of pumps may also be used where there is a restriction on the size of the pump due to form factor limitations. Here many small pumps in parallel can be used instead of a one big sized pump.

Figure 7:
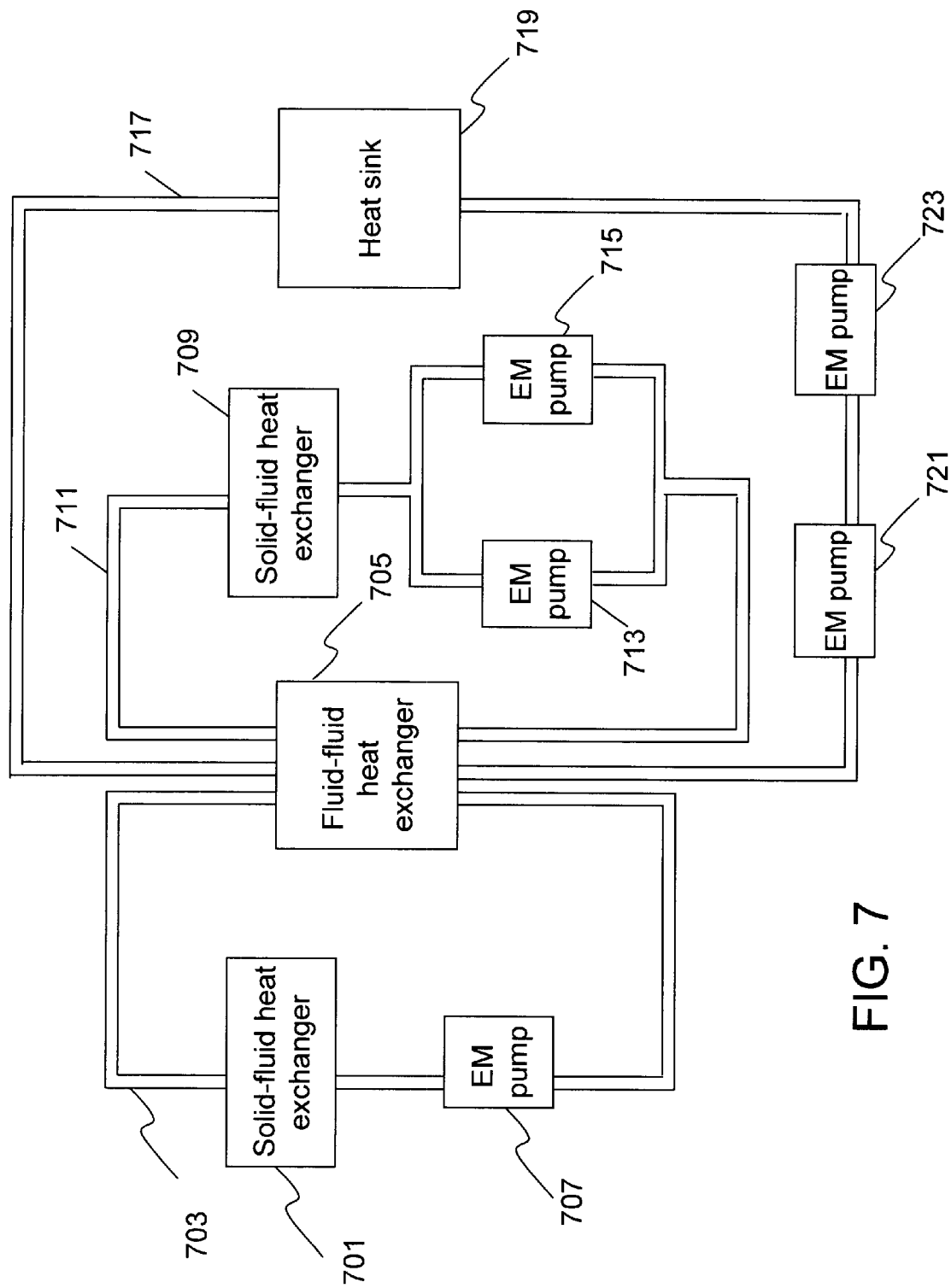
FIG. 7 shows a complex network that utilizes a combination of multiple primary and secondary closed conduits for removing heat from multiple high power density devices.

It will be apparent to one skilled in the art that the abovementioned embodiments may be combined in many ways to achieve flexibility in construction of heat dissipation systems. FIG. 7 shows one such design of a heat dissipating system. A solid-fluid heat exchanger 701 placed adjacent to high power density device (not shown in FIG. 7) contains liquid metal. A conduit 703 passes through solid-fluid heat exchanger 701, carries away hot liquid metal and dissipates heat at a fluid-fluid heat exchanger 705. EM pump 707 powers the flow of liquid metal in closed conduit 703. A solid-fluid heat exchanger 709 (containing liquid metal) is placed adjacent to a second high power density device. A conduit 711 carries hot liquid metal away from solid-fluid heat exchanger 709 and dissipates heat at fluid-fluid heat exchanger 705. Two electromagnetic pumps 713 and 715 power the flow of liquid metal in closed conduit 711. Electromagnetic pumps 713 and 715 are connected in parallel. The heat transferred by conduits 703 and 711 to fluid-fluid heat exchanger 705 is carried away by the liquid metal in closed conduit 717. This heat is dissipated at heat sink 719. A pair of electromagnetic pumps 721 and 723 power the flow of liquid metal in closed conduit 717. Electromagnetic pumps 721 and 723 are connected in series.

This embodiment demonstrates the flexibility achieved by using liquid metal as a heat transfer medium. Closed conduits 703 and 709 (where liquid metal absorbs heat directly from high power density device) can be seen as primary closed conduits. Closed conduit 717 can be seen as a secondary closed conduit (where liquid metal absorbs heat dissipated by other closed conduits). Thus, liquid metal in primary closed conduits 703 and 711 dissipates heat at common fluid-fluid heat exchanger 705. This heat is carried away by liquid metal in secondary closed conduit 717and dissipated at heat sink 719. It will be apparent that more complex networks of primary closed conduits and secondary closed conduits may be provided without departing from the scope of the invention. For example a network may have a plurality of primary and secondary closed conduits that dissipate heat at a common heat exchanger.

Besides physical flexibility, the use of liquid metal also provides design flexibility. As a result of the design flexibility, design of circuits based on electric considerations can be first worked out. Once the electric circuits have been designed, the liquid loops can be designed based on the form factor limitations (due to the circuit components). This approach enables the design of a circuit without taking thermal considerations in account in the first place.

The system may further include a heat spreader positioned adjacent to the high power density device. The heat spreader can include a plurality of cooling chambers containing liquid metal and a plurality of electromagnetic pumps arranged in a configuration so as to circulate the liquid metal in the cooling chambers From the above discussion it is evident that liquid metal heat transfer provides a highly flexible method of heat removal. The various embodiments provided by the invention may be used in computational devices such as laptops to dissipate heat generated by the central processing unit. The flow of liquid metal in conduits (made of polymers) provides a lot of flexibility to carry away the heat and dissipate it at a heat sink placed at bottom or screen of the laptop. The fluid conduit can be flexed, or bent, allowing the flow of liquid metal to be routed across hinges (in a laptop).

The networks of primary and secondary closed conduits provided by the invention can be used for cooling multiple processors in a server where several discrete high power density devices are located in close physical proximity. Primary closed conduits may be used to dissipate heat locally while secondary closed conduits can carry away this heat and dissipate it at distant less-populated areas on the board.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A system for dissipating heat from a high power density device, the system comprising:
   a. a solid-fluid heat exchanger placed adjacent to the high power density device, the solid-fluid heat exchanger containing liquid metal;
   b. means for cooling the liquid metal, the cooling means being placed at a predefined distance away from the solid-fluid heat exchanger;
   c. at least one conduit passing through the solid-fluid heat exchanger and the cooling means in the form of a closed loop, the conduit circulating the liquid metal between the solid-fluid, heat exchanger and the cooling means;
   d. at least one electromagnetic pump for pumping the liquid metal through the conduit,
wherein heat is transferred away from the high power density device to the cooling means through the liquid metal contained in the conduit, the liquid metal being circulated in the conduit by the electromagnetic pump.

2. The system as recited in claim 1 wherein the predefined distance for placing the cooling means is determined on the basis of the form factor.

3. The system as recited in claim 1 wherein the liquid metal contained in the solid-fluid heat exchanger is an alloy of gallium and indium.

4. The system as recited in claim 1 wherein the liquid metal contained in the solid-fluid heat exchanger is selected from a group consisting of indium, gallium, mercury, bismuth tin alloy, bismuth lead alloy and sodium potassium eutectic alloy.

5. The system as recited in claim 1 wherein the conduit is constructed using a material selected from a group consisting of polymers and refractory metals.

6. The system as recited in claim 1 further comprising:
   a. a thermoelectric cooler placed between the solid-fluid heat exchanger and the high power density device, the thermoelectric cooler providing primary spot cooling of the high power density device.

7. The system as recited in claim 1 wherein the system further comprises an electromagnetic interference shield.

8. The system as recited in claim 1 further comprising a heat spreader positioned adjacent to the high power density device.

9. The system as recited in claim 1 wherein the heat spreader further comprises:
   I. a plurality of cooling chambers containing liquid metal;
   II. a plurality of electromagnetic pumps arranged in a configuration so as to circulate the liquid metal in the cooling chambers.

10. A system for transporting heat away from a high power density device, the system comprising:
    a. a solid-fluid heat exchanger placed adjacent to the high power density device, the solid-fluid heat exchanger containing liquid metal;
    b. means for cooling the liquid metal, the cooling means placed at a predefined distance away from the solid-fluid heat exchanger;
    c. at least one conduit passing through the solid-fluid heat exchanger and the cooling means in the form of a closed loop for circulating the liquid metal between the solid-fluid heat exchanger and the cooling means, the conduit having a hot region carrying hot liquid metal from the solid-fluid heat exchanger to the cooling means and a cold region carrying cold liquid metal from the cooling means to the solid-fluid heat exchanger;
    d. at least one electromagnetic pump for pumping the liquid metal through the conduit;
    e. a thermoelectric generator for generating power for running the electromagnetic pumps, one end of the thermoelectric generator being placed in contact with the hot region of the conduit while the other end being placed in contact with the cold region of the conduit, the thermoelectric generator utilizing the temperature difference between its ends to generate power;
whereby heat is transferred away from the high power density device to the cooling means through the liquid metal contained in the conduit, the liquid metal being circulated in the conduit by the electromagnetic pump.

11. The system as recited in claim 10 further comprising:
    a. A thermoelectric cooler placed between the solid-fluid heat exchanger and the high power density device, the thermoelectric cooler providing primary spot cooling of the high power density device.

12. The system as recited in claim 10 wherein the means for cooling is selected from a group consisting of heat sink, fluid-fluid heat exchanger, thermoelectric cooler and vapor compression cooler.

13. The system as recited in claim 10 wherein the means for cooling is a refrigerator for chilling the liquid metal.

14. A method for dissipating heat away from a high power density device, the high power density device placed adjacent to a solid-fluid heat exchanger containing liquid metal, the method comprising:

a. transferring heat from the high power density device to the liquid metal placed in the solid-fluid heat exchanger;

b. transporting the liquid metal through a conduit passing through the solid-fluid heat exchanger to a heat sink placed at a predefined distance away from the solid-fluid heat exchanger;

c. dissipating heat at the heat sink;

d. transporting cooled liquid metal back to the solid-fluid heat exchanger.

15. The system as recited in claim 1 wherein the system comprises a plurality of electromagnetic pumps in series.

16. The system as recited in claim 1 wherein the system comprises a plurality of electromagnetic pumps in parallel.

* * * * *

UNITED STATES PATENT AND TRADEMARK OFFICE
CERTIFICATE OF CORRECTION

PATENT NO. : 6,658,861 B1
DATED : December 9, 2003
INVENTOR(S) : Uttam Ghoshal and Andrew Carl Miner It is certified that error appears in the above-identified patent and that said Letters Patent is hereby corrected as shown below:

Column 1,
Line 42, "temperature. buildup" should read -- temperature buildup --.

Column 2,
Line 61, "invention-to" should read -- invention to --.

Column 5,
Line 55, "Gain" should read -- GaIn --.

Column 7,

Line 6, "where E is the thermodynamic" should read -- where $\varepsilon$ is the thermodynamic --.

Column 9,
Line 24, "cooling chamber" should read -- cooling chamber. -- and "From the above discussion" should begin a new paragraph.
Line 62, "solid-fluid, heat" should read -- solid-fluid heat --.

Signed and Sealed this

Twelfth Day of October, 2004

JON W. DUDAS
*Director of the United States Patent and Trademark Office*